United States Patent [19]

Kitamura

[11] Patent Number: 5,367,931
[45] Date of Patent: Nov. 29, 1994

[54] CUTTING APPARATUS FOR CUTTING STRIP MATERIAL BY A PLURALITY OF SLITTER UNITS TO OBTAIN A PLURALITY OF RIBBON CORE MATERIALS IN ONE OPERATION WITH HIGH PRECISION

[75] Inventor: Fumio Kitamura, Chino, Japan

[73] Assignee: Kitamura Kiden Co., Ltd., Chino, Japan

[21] Appl. No.: 880,042

[22] Filed: May 7, 1992

[30] Foreign Application Priority Data

Apr. 22, 1992 [JP] Japan .................. 4-103020

[51] Int. Cl.⁵ ............................................. B26D 7/06
[52] U.S. Cl. ............................... 83/407; 83/425.2; 83/428
[58] Field of Search .......... 83/428, 425.2, 407, 83/107, 102, 104

[56] References Cited

U.S. PATENT DOCUMENTS

| | | | |
|---|---|---|---|
| 3,187,612 | 6/1965 | Hervey | 83/407 X |
| 3,272,042 | 9/1966 | Haas | 83/428 X |
| 3,282,525 | 11/1966 | Rehr | 83/428 X |
| 3,869,997 | 3/1975 | German | 83/428 X |
| 4,266,112 | 5/1981 | Niedermeyer | 83/428 X |
| 4,358,978 | 11/1982 | Lawson | 83/428 X |
| 4,573,382 | 3/1986 | Kloehn | 83/428 X |
| 4,605,392 | 8/1986 | Achelpohl et al. | 83/428 X |
| 4,711,019 | 12/1987 | Albeck et al. | |
| 4,757,732 | 7/1988 | Arima | 83/425.2 |
| 4,842,208 | 6/1989 | Kitamura | |
| 4,844,312 | 7/1989 | Gomi et al. | |
| 4,848,684 | 7/1989 | Sasaki et al. | |
| 4,922,775 | 5/1990 | Winter | 83/428 X |
| 4,931,140 | 6/1990 | Peltola et al. | 83/428 X |
| 5,042,736 | 8/1991 | Nomura et al. | |

FOREIGN PATENT DOCUMENTS

| | | |
|---|---|---|
| 243756 | 11/1987 | European Pat. Off. . |
| 255674 | 2/1988 | European Pat. Off. . |
| 2565216 | 12/1985 | France . |
| 75577 | 6/1894 | Germany . |
| 860825 | 12/1952 | Germany . |
| 938860 | 2/1956 | Germany . |
| 1454971 | 9/1970 | Germany .................. 83/428 |
| 2719075 | 11/1977 | Germany . |
| 55-33405 | 3/1980 | Japan . |
| 55-132027 | 10/1980 | Japan . |
| 56-80113 | 7/1981 | Japan . |
| 60-28375 | 2/1985 | Japan . |
| 61-22851 | 1/1986 | Japan . |
| 63-132408 | 6/1988 | Japan . |
| 63-132412 | 6/1988 | Japan . |
| 63-168013 | 7/1988 | Japan . |
| 63-168014 | 7/1988 | Japan . |
| 63-188916 | 8/1988 | Japan . |
| 2-89304 | 3/1990 | Japan . |
| 2154494 | 9/1985 | United Kingdom . |
| 2172229 | 9/1986 | United Kingdom . |

OTHER PUBLICATIONS

Abstract of Soviet Patent No. 1343-452-A, May 24, 1985, entitled "Choke magnetic cores of balance system mfg. . . . ", published in *Soviet Inventions Illustrated*, Sec. E1: Electrical, Week 8818, Jun. 15, 1988, Derwent Publications Ltd., 2 pages.

*Primary Examiner*—Mark Rosenbaum
*Assistant Examiner*—Frances Han
*Attorney, Agent, or Firm*—Merchant, Gould, Smith, Edell, Welter & Schmidt

[57] ABSTRACT

A cutting apparatus for a strip of a ribbon core comprises a plurality-of slitter units for cutting traveling strip material into a predetermined configuration of ribbon core materials. The slitter units are arranged in off-set positions in the traveling direction of the strip material, and one of the strip material cut by each of the slitter units is fed upwardly or downwardly rounding about a traveling line, through which the other of the cut strip material is fed. Therefore, guide rollers can be provided upstream and downstream of each of the slitter units, and a width detecting means can be provided for each of the ribbon core materials, so that a plurality of ribbon core materials can be formed in one time with high precision.

13 Claims, 16 Drawing Sheets

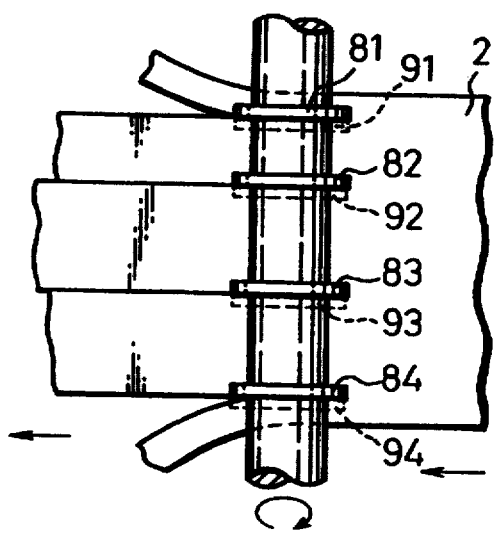

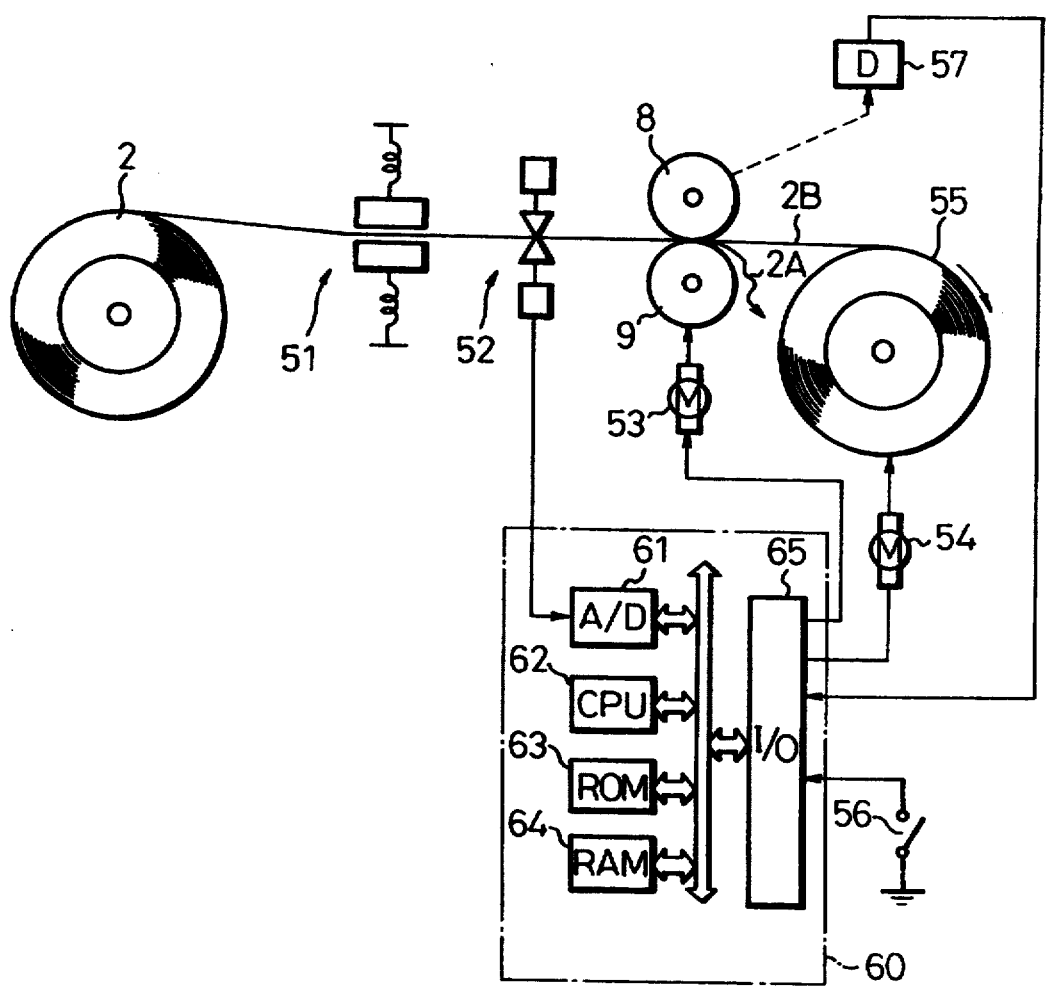

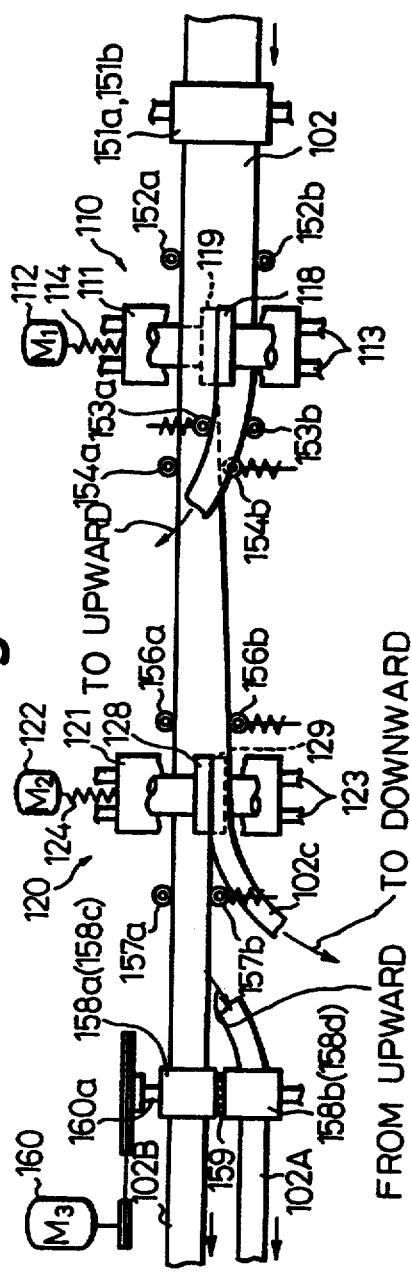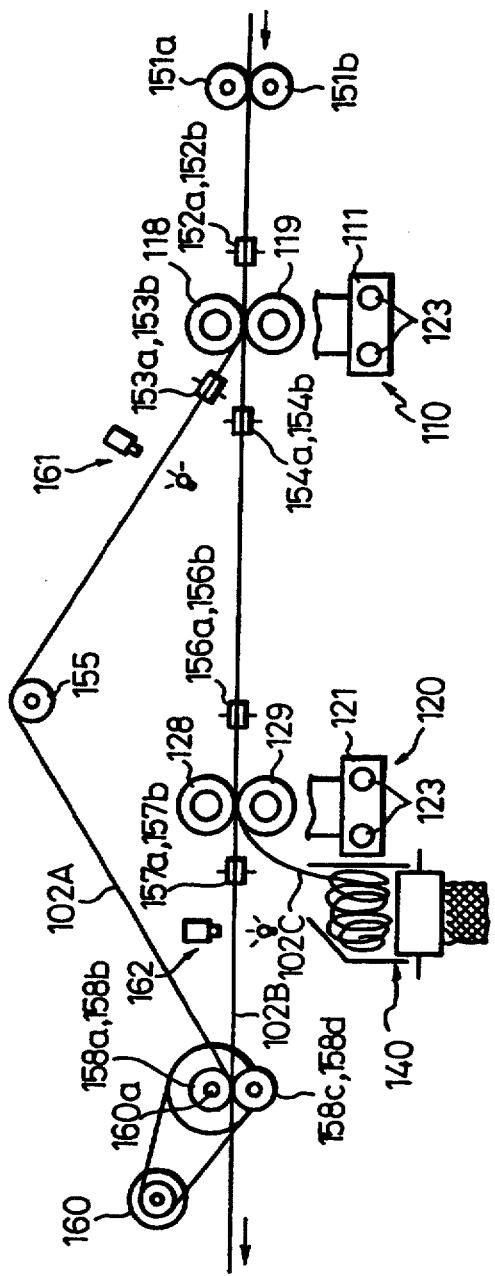

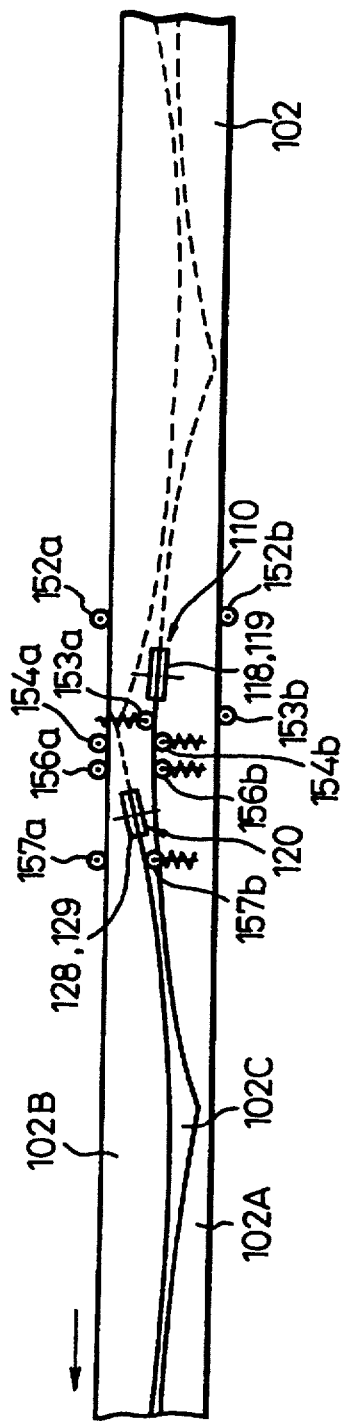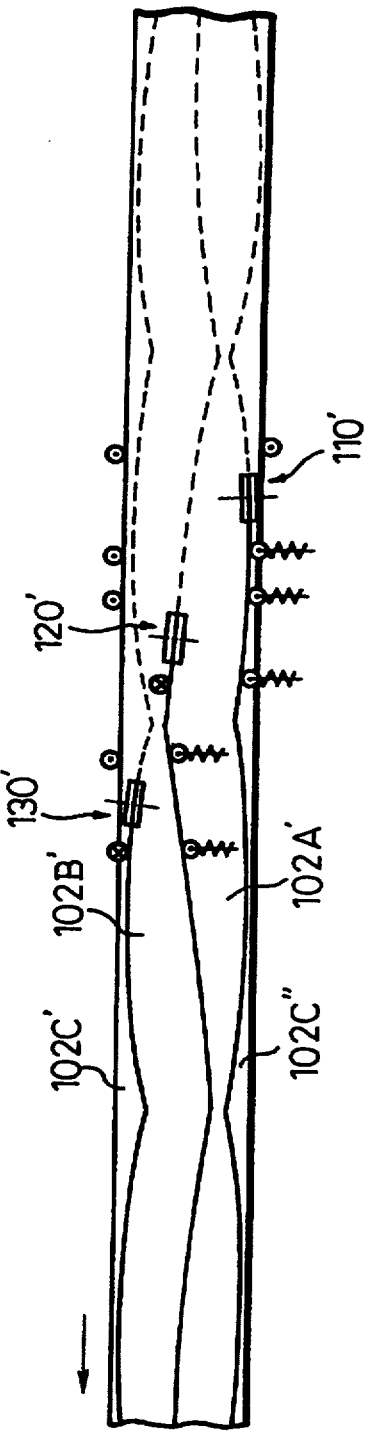

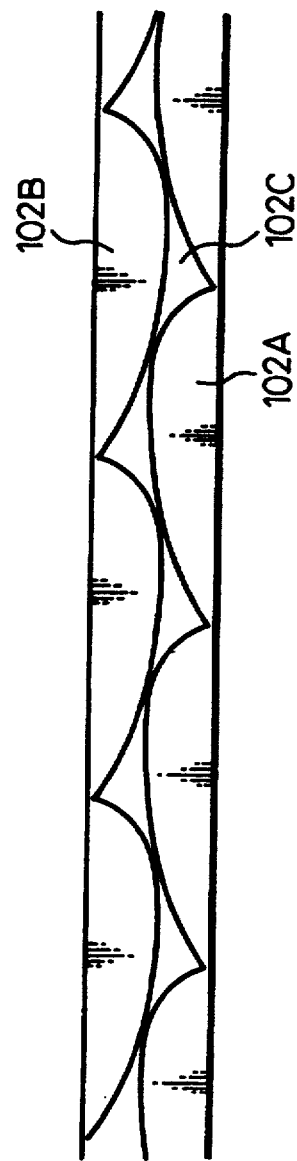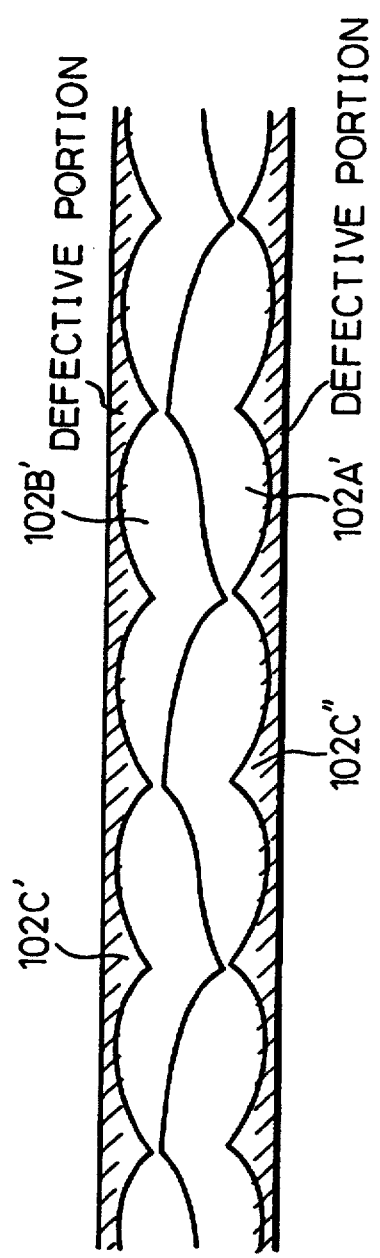

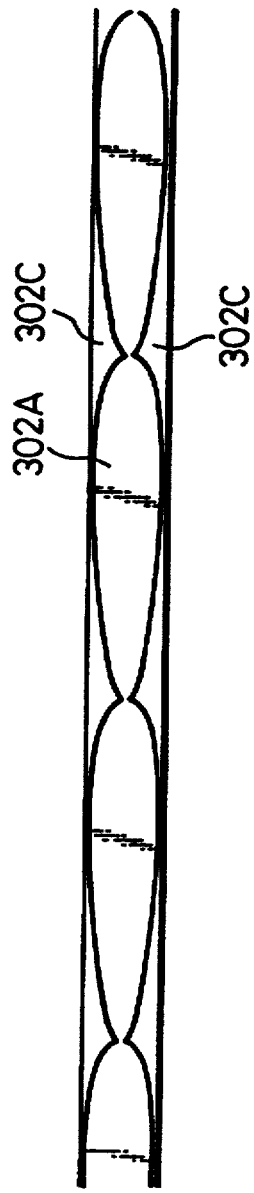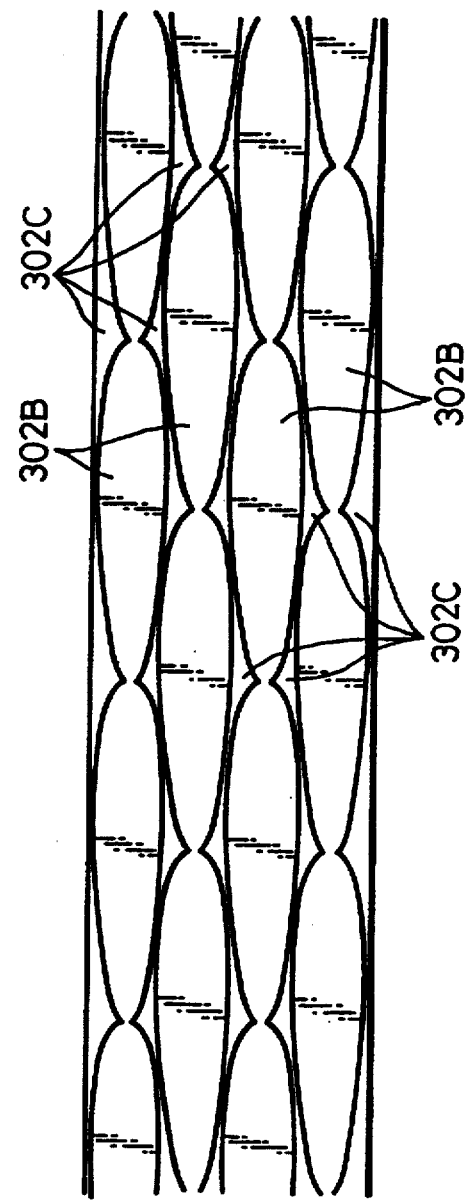

CUTTING APPARATUS FOR CUTTING STRIP MATERIAL BY A PLURALITY OF SLITTER UNITS TO OBTAIN A PLURALITY OF RIBBON CORE MATERIALS IN ONE OPERATION WITH HIGH PRECISION

BACKGROUND OF THE INVENTION

1. Field of the Invention

The present invention relates to a cutting apparatus for a strip of a ribbon core, more particularly, to a cutting apparatus for cutting a flat rolled magnetic steel strip into a curved configuration to form a ribbon core of a transformer having a circular cross-section.

2. Description of the Related Art

Recently, there have been provided transformers using cylindrical coil bobbins and winding coils on ribbon cores with circular cross-section. The transformers with ribbon cores having a circular cross-section and cylindrical coil bobbins are advantageous because they are ultra thin, compact, and light weight.

Conventionally, slitter devices (cutting apparatuses for strips) are generally designed for cutting along a straight line, which forms a pair of respective shafts at the upper and lower edges of the strip and provides round teeth for the respective shafts for the performing cutting operation. In the prior art, the cutting apparatus for cutting the strips into a desired curved configuration has been proposed in, for example, Japanese Examined Patent Publication (Kokoku) No. 60-28375 (Japanese Unexamined Patent Publication (Kokai) No. 55-33405), Japanese Unexamined Patent Publication No. 55-132027, Japanese Unexamined Patent Publication No. 63-168013, and Japanese Unexamined Patent Publication No. 2-89304, have all been invented by including the same inventor of the present application and filed by the applicant of the present application. Furthermore, the conventional cutting apparatus that can cut the ribbon core strip into a plurality of curved configurations has been proposed in Japanese Examined Patent Publication No. 61-22851 (Japanese Unexamined Patent Publication No. 56-80113), for example.

SUMMARY OF THE INVENTION

An object of the present invention is to provide a cutting apparatus for a strip of a ribbon core to cut a flat rolled magnetic steel strip into a desired curved configuration, which can cut a plurality of ribbon core strips in one operation with high precision.

According to the present invention, there is provided a cutting apparatus for a strip of a ribbon core for obtaining a predetermined configuration of ribbon core materials by cutting traveling strip material by means of a plurality of slitter units, wherein the slitter units are arranged in off-set positions in the traveling direction of the strip material, and one of the strip material cut by each of the slitter units is fed upwardly or downwardly rounding about a traveling line, through which the other of the cut strip material is fed.

Further, according to the present invention, there is also provided a cutting apparatus for a strip of a ribbon core for obtaining a predetermined configuration of ribbon core materials by cutting traveling strip material by means of a plurality of slitter units, wherein the slitter units are arranged in off-set positions in the traveling direction of the strip material, and an angle for cutting the strip material of each of the slitter units is independently controlled.

The cutting apparatus for the strip of the ribbon core may further comprise a plurality of width detecting units for detecting a width of each of the ribbon core materials cut by the slitter units. Guide rollers may be provided upstream and downstream of each of the slitter units. Some of the guide rollers may include width variation following units for following variation of the width of the strip materials.

Each of the slitter units may comprise a pair of slitter round teeth, a movable base mounting the pair of slitter round teeth, and a cutting width controlling unit for controlling movement of the movable base in transverse direction of the strip material. The slitter unit further may comprise damping units for damping the vibration of the slitter round teeth. The cutting apparatus for the strip of the ribbon core may further comprise drive units for driving a plurality of strip materials cut by the slitter unit, the drive units may comprise a first driving roller fixed to an axle rotatingly driven by a driving motor, and a second driving roller rotatably provided relative to the axle and rotatingly driven by the first driving roller through a friction member, and may drive so that the tensions of the cut strip materials become uniform.

The cutting apparatus for the strip of the ribbon core may further comprise an unnecessary material processing unit for processing an unnecessary material of the strip material, the unnecessary material processing unit being located above or beneath the traveling line of the strip material. The unnecessary material processing unit may further comprise a magnet roller for certainly guiding the unnecessary material, and an edge for separating the unnecessary material from the magnet roller. The unnecessary material processing unit may be adapted to crush the unnecessary material by unit of two rollers with chamfering grooves.

BRIEF DESCRIPTION OF THE DRAWINGS

The present invention will be more clearly understood from the description of the preferred embodiments as set forth below with reference to the accompanying drawings, wherein:

FIG. 6 is a view showing an example of the slitter edge provided for the cutting apparatus for the strip of the ribbon core according to the prior art;

FIG. 9 is a view showing another example of a cutting apparatus for a strip of a ribbon core according to the prior art;

FIGS. 10A and 10B are views fragmentally showing an embodiment of a cutting apparatus for a ribbon core strip according to the present invention;

FIGS. 11A and 11B are views for explaining the operation of the slitter edge in the cutting apparatus for the strip of the ribbon core shown in FIGS. 10A and 10B;

FIGS. 12A and 12B are views showing examples of strip materials to be cut by the cutting apparatus for the strip of the ribbon core according to the present invention;

FIGS. 13A and 13B are views showing other examples of strip materials to be cut by the cutting apparatus for the strip of the ribbon core according to the present invention;

DESCRIPTION OF THE PREFERRED EMBODIMENTS

For a better understanding of the preferred embodiments, the problems of the related art will be explained, with reference to FIGS. 1 to 9. Note, FIGS. 1 to 5B show an apparatus disclosed in Japanese Unexamined Patent Publication No. 55-132027, FIGS. 6 to 8C show a ribbon core producing apparatus disclosed inn Japanese Examined Patent Publication 60-28375 (Japanese Unexamined Patent Publication No. 55-34405), and FIG. 9 shows a strip cutting control apparatus for a ribbon core disclosed in Japanese Unexamined Patent Publication No. 63-168013.

Figure 1:
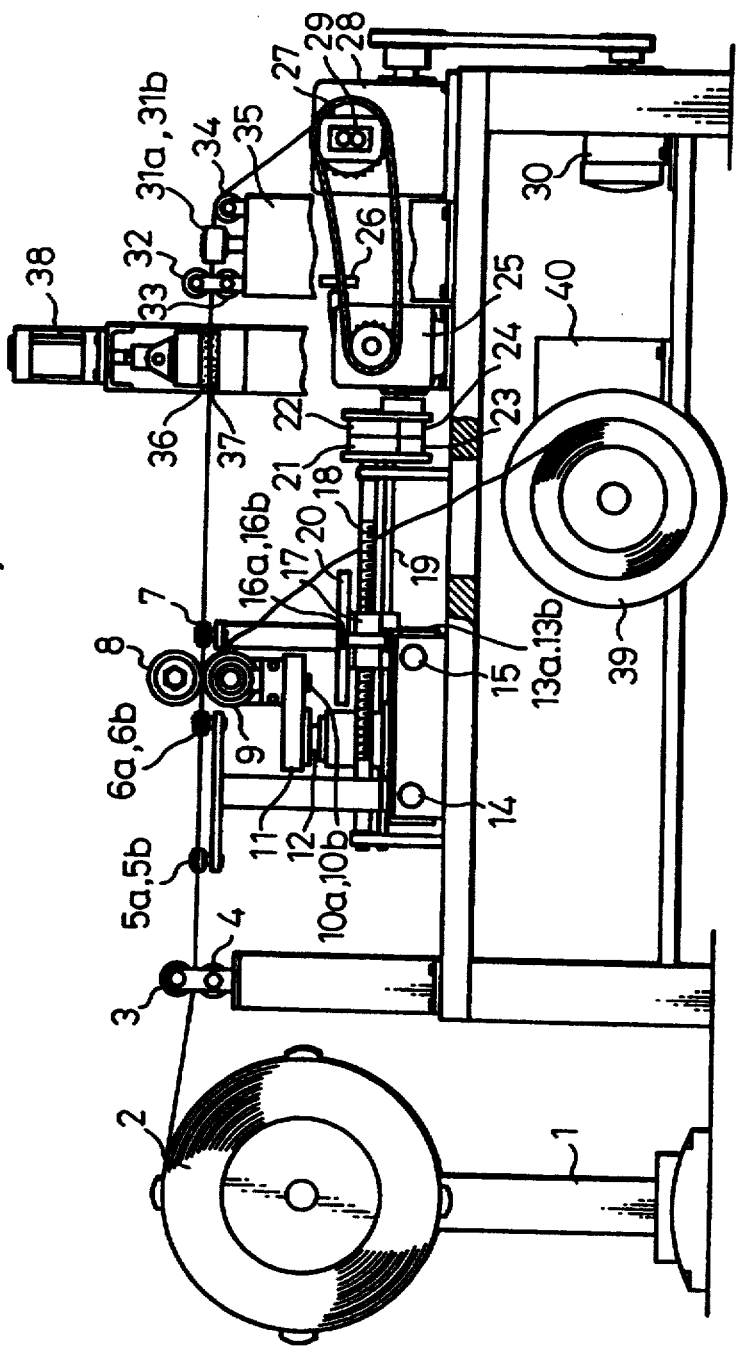
FIG. 1 is a side elevation view showing an example of a cutting apparatus for a strip of a ribbon core according to the prior art.
Figure 2:
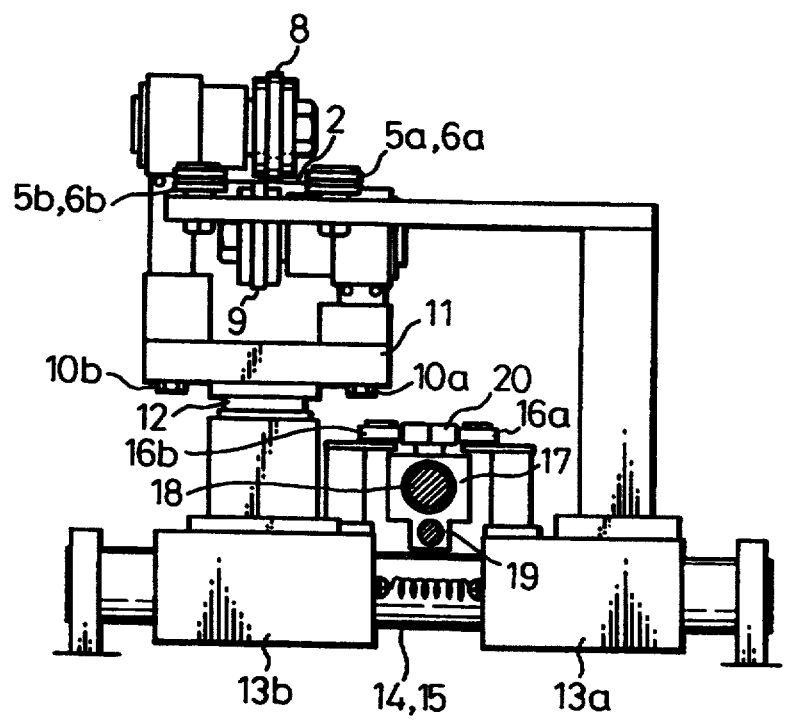
FIG. 2 is a front elevation view showing main portions of the cutting apparatus for the strip of the ribbon core shown in FIG. 1.

FIG. 1 is a side elevation view showing an example of a cutting apparatus for a strip of a ribbon core according to the prior art, and FIG. 2 is a front elevation view showing main portions of the cutting apparatus for the strip of the ribbon core shown in FIG. 1.

As shown in FIGS. 1 and 2, in the conventional cutting apparatus for the ribbon core strip (cutting apparatus for the strip of the ribbon core according), one end of a strip material (material) held on a reel stand 1 passes between guide rollers 3 and 4, gripped by grooved guide rollers 5a, 5b and 6a, 6b and cut by slitter round teeth 8 and 9. The cut ribbon core strips (strip material) are provided a tension by means of friction materials 36, 37 ensuring that the center position in the transverse direction to be constant by gripping with self-aligning rollers 31a and 31b, and then winding on a winding jig and formed into a product 27 (transformer ribbon core with a circular cross-section). A base 11 supporting the slitter mechanism is held by a free rotation shaft 12. The free rotation shaft 12 is held on a movable base 13b.

Namely, since the slitter mechanism is held by the free rotation shaft 12, and the slitter round teeth 8, 9 are arranged rearward relative to the shaft and the flow of the material, the cutting width is varied according to the shifting of the copying model to automatically vary the direction of the cut, thereby enabling a curved configuration to be cut.

On the other hand, the position of the material fed into the slitter round teeth 8, 9 is determined by the grooved guide rollers 5a, 5b; 6a, 6b cooperate with the movable base 13a, the width of the material (strip material) 2 to be cut is defined by the relative positional relationship between the movable bases 13a and 13b. Namely, by pressure contact of the copying rollers 16a and 16b onto the copying model 20 coupled with the movable bases 13a and 13b, the cutting width of the material is controlled to be a width equal to that of the copying model 20. It should be appreciated that, in FIGS. 1 and 2, the reference numeral 7 denotes a guide roller, 14, 15 denote movable base supporting rails.

In the further detailed discussion for the apparatus illustrated in FIGS. 1 and 2, a winding jig 29 fixed to a winding shaft of a winder 28 is rotatingly driven by a motor 30, thereby winding one end of the strip (2) cut into the desired configuration from the material 2. The strip 2 is gripped by the self-aligning rollers 31a and 31b to maintain the correct position so that the center is maintained coincident with the center of the winding surface of the winding jig 29 even when the width of the strip varies. Note, two self-aligning rollers 31a and 31b maintain an approximate distance relative to the center line at both sides of the center line of the strip by means of a self-aligning mechanism 35. It should be noted that the reference numeral 34 denotes a winding guide roller.

The winding shaft rotates to wind up the strip 2. On the other hand, the rotation of the winding shaft is transmitted to a transmission 25 including a transmission ratio fine adjustment device 26. A reversible transmission device 23 and 24 that can be rotated in forward and reverse directions are coupled with the output shaft of the transmission 25. Namely, the member 23 rotates in a forward direction and the member 24 rotates in a reverse direction, rotations of which are respectively transmitted to a forward rotation electromagnetic clutch 21 and a reverse rotation electromagnetic clutch 22. By switching the power supply for the respective clutches, a feeding screw 18, as the common shaft of both clutches, is driven in forward and reverse directions to vary the shifting direction of a feeding platform 17 engaged with the feeding screw.

The copying model 20 is fixed on the feeding platform. On the other hand, at both side surfaces of the copying model 20, copying rollers 16a and 16b are pressingly contacted. By rotating the feeding screw, the copying model 20 is shifted to vary the relative distance with the copying rollers 16a and 16b, the movable bases 13a and 13b are shifted. By this, the grooves guide rollers 5a, 5b, 6a and 6b coupled with the movable base 13a determine the position of the strip material. The position of the slitter mechanism composed of the slitter round teeth 8 and 9, the base 11, free rotating shaft 12 and associated parts thereof, which are coupled with the movable base 13b to automatically vary the direction of the slitter mechanism toward the direction of cutting so that the traveling strip material is cut into the curved configuration according to the variation of the width of the copying model 20. Note, the reference numeral 10a and 10b denote slitter round teeth position adjusting devices. It should be noted that the cut strip (material) passes between the friction materials 36 and 37. At this time, since a pressure cylinder 38 exerts a pressure to provide high frictional resistance, tension is applied to the strip to permit tight winding.

Though the foregoing discussion is directed to an arrangement that winds the strip immediately after cutting the same into a curved configuration with the slitter, to form the ribbon core with a circular cross section, it is possible to provide the slitter mechanism and the winding mechanism separately to temporarily wind the strip cut into a predetermined configuration by the apparatus having the slitter mechanism, and then, to wind the strip on the winding jig to form the ribbon core with a circular cross-section with the apparatus having the winding mechanism.

In practice, in the case of the cutting apparatus for the ribbon core strip comprising the slitter mechanism and a cutting width control mechanism, rubber rollers 32 and 33 are driven to rotate by a driving force obtained from the winding shaft of the winder 28 to feed the material, and is temporarily wound on a temporary winding reel provided separately (see FIG. 9).

Then, by winding the strip on the winding jig by the winding mechanism, including the self-aligning mechanism and the frictional tension mechanism, from the temporarily wound temporary winding reel, a ribbon core similar to the above can be formed. It should be noted that the copying model and construction associated thereto, can be differentiated from that illustrated by driving the movable bases 13a and 13b in cooperation with a numerical control apparatus and so forth (see FIG. 9).

Figure 3A:
FIG. 3A is a view showing an example of a copying model provided for the cutting apparatus for the strip of the ribbon core shown in FIGS. 1 and 2.

FIG. 3A shows an example of a copying model provided for the cutting apparatus for the strip of the ribbon core shown in FIGS. 1 and 2, and FIGS. 3B and 3C show examples of strip materials cut by using the copying model shown in FIG. 3A.

Figure 3B:
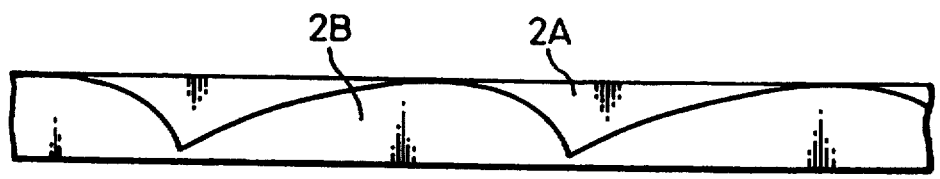
FIGS. 3B and 3C are views showing examples of strip materials cut by using the copying model shown in FIG. 3A.
Figure 3C:
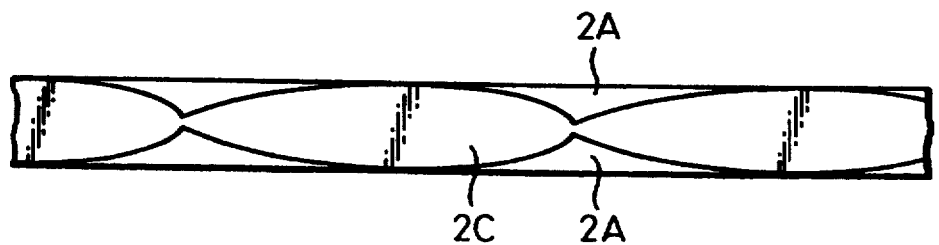

As described above, since the copying model 20 shifts the position by rotation of the feeding screw 18, by shaping the copying model 20 into the configuration as shown in FIG. 3A, for example, and by driving the feeding screw 18 to rotate in synchronism with the rotation of the winding shaft, the cutting width of the material can be varied in synchronism with the winding to allow continuous cutting of the strip 2B in a configuration shown in FIG. 3B to form the ribbon core of the circular cross-section on the winding jig 29.

The strip 2B shown in FIG. 3B is illustrated with a scale of approximately 1/100 in the longitudinal direction and has a winding start position at the right side end and a winding end position at the left side end. Furthermore, as shown in FIG. 3B, a plurality of the strips 2B are cut continuously. When the strip 2B is wound on the winding jig 29, the strip 2B is cut at the winding end portion and then welded and so forth to form the ribbon core. On the other hand, the strip 2B is straight on one side and curved on the other side. However, in the practical configuration of the strip, since the longitudinal direction is 100 times that of the shown configuration, for example, as set forth above, the curved side is substantially moderate to make it difficult to distinguish between the straight side. By winding on the winding jig and maintaining the transverse center accurately throughout the winding operation, the cross-sectional configuration certainly becomes circular configuration. Note, the strip 2C shown in FIG. 3c can be formed by preliminarily preparing the material 2, one side of which is cut by the slitter mechanism and the other side is cut with the cutting apparatus of FIGS. 1 and 2 and wound onto the winding jig 29. It should be noted that the reference numeral 2A denotes unnecessary material left after cutting the strips 2B and 2C from the strip material 2, which unnecessary material 2A is wound by unnecessary material winding apparatus 39 and 40 shown in FIG. 1.

Figure 4A:
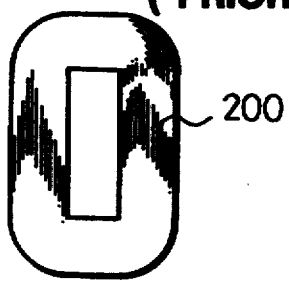
FIGS. 4A to 4D are views showing examples of ribbon cores with circular cross-section formed by winding strip materials.
Figure 4C:
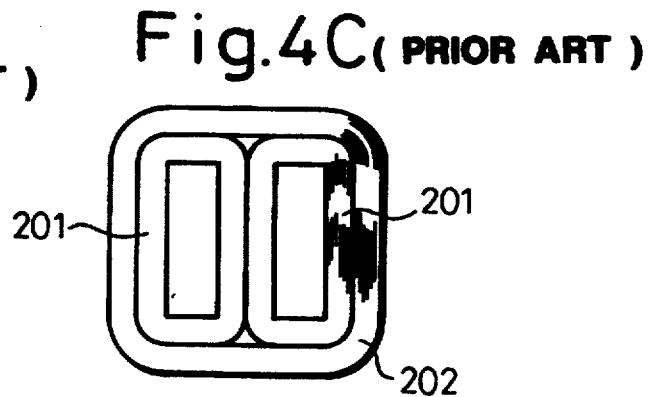
Figure 4B:
Figure 4D:
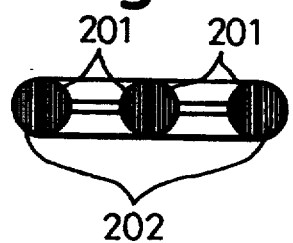

FIGS. 4A to 4D show examples of ribbon cores with circular cross-section formed by winding strip materials. Note, FIGS. 4A and 4C respectively show plan views of the ribbon cores, and FIGS. 4B and 4D show sectional views thereof shown in FIGS. 4A and 4C.

Namely, by winding the strip 2B (2C) to the above-mentioned winding jig 29, the ribbon core 200 with the circular cross-section, as shown in FIGS. 4A and 4B can be formed. On the other hand, in the ribbon core shown in FIGS. 4A and 4B, by setting the configuration of the strip up to the portion having the maximum strip width and winding such strip on the winding jig 29, the ribbon core 201 with semi-circular cross-section as shown in FIGS. 4C and 4D can be formed. By tightly fitting two ribbon cores 201 and winding a strip having configuration gradually reducing the width, the ribbon core with the circular cross section can be formed.

Figure 5A:
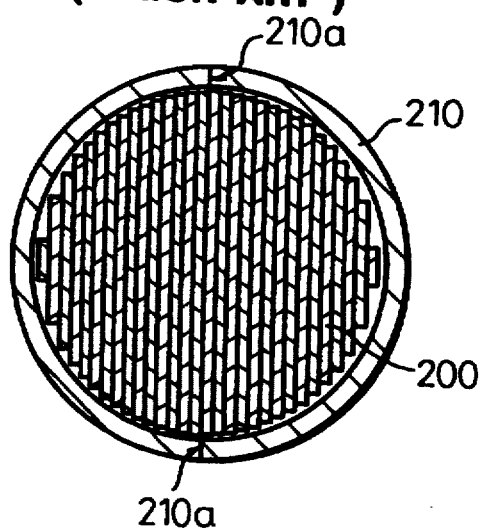
FIGS. 5A and 5B are views showing the manner of mounting coil bobbins to the ribbon core shown in FIGS. 4A and 4B.
Figure 5B:
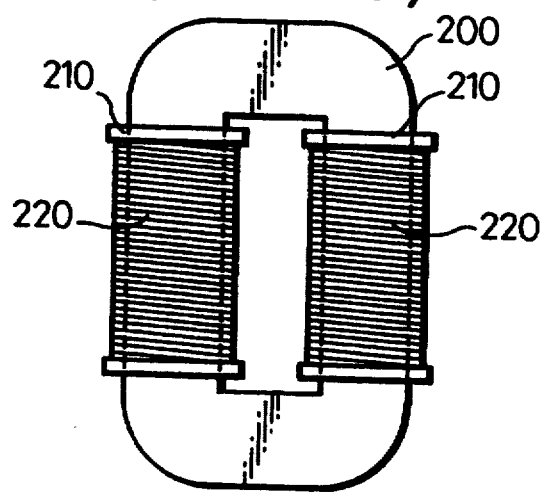

FIGS. 5A and 5B show a manner of mounting coil bobbins to the ribbon core shown in FIGS. 4A and 4B. Namely, FIGS. 5A and 5B shows a manner of setting the cylindrical coil bobbin 210 to the ribbon core 200 with circular cross-section, and (b) illustrates the condition, in which the two coil bobbins are set for the ribbon core 200 and winding 220.

As shown in FIG. 5A, the cylindrical coil bobbin 210 has a semi-circular configuration separated into two along the longitudinal direction, and provided for covering a ribbon core 200 with a circular cross section. The coil bobbin 210 is mounted on the ribbon core 200 with tightly fitting two interfacing surfaces 210a. Furthermore, by rotating this coil bobbin 210, the winding 220 is wound around the coil bobbin to form the transformer as shown in FIG. 5B.

Figure 7A:
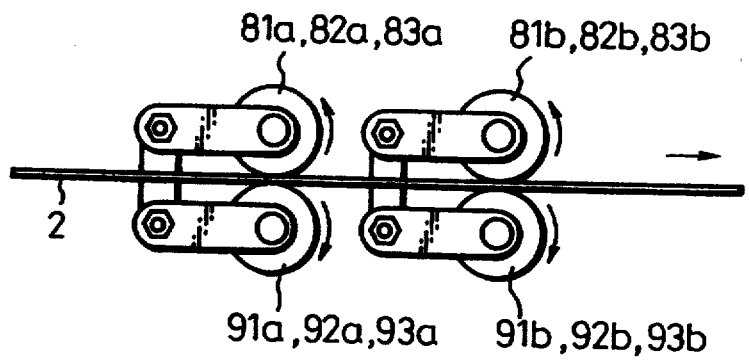
FIGS. 7A and 7B are views showing another example of the slitter edge provided for the cutting apparatus for the strip of the ribbon core according to the prior art.
Figure 7B:
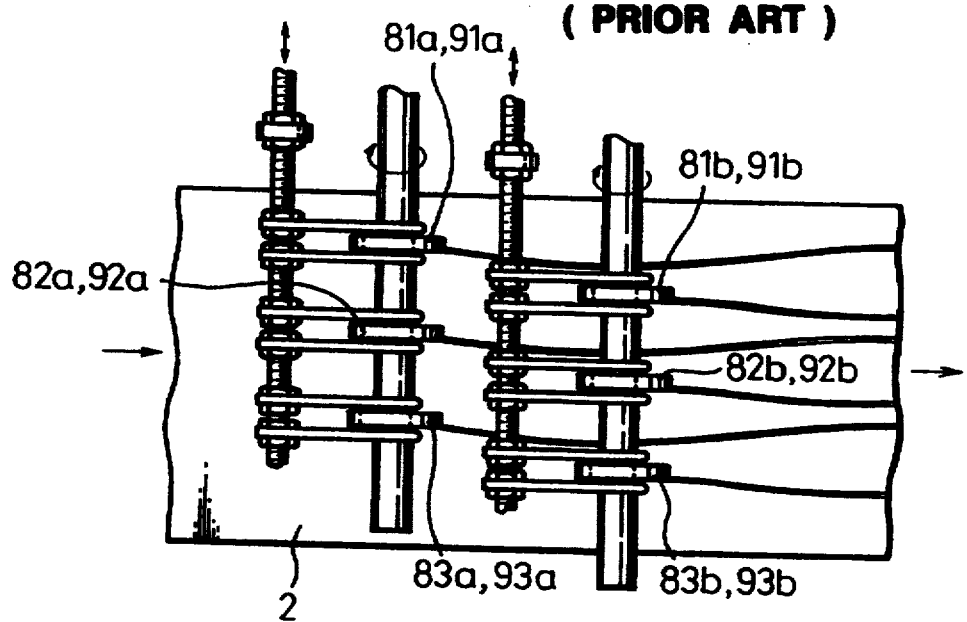
Figure 8A:
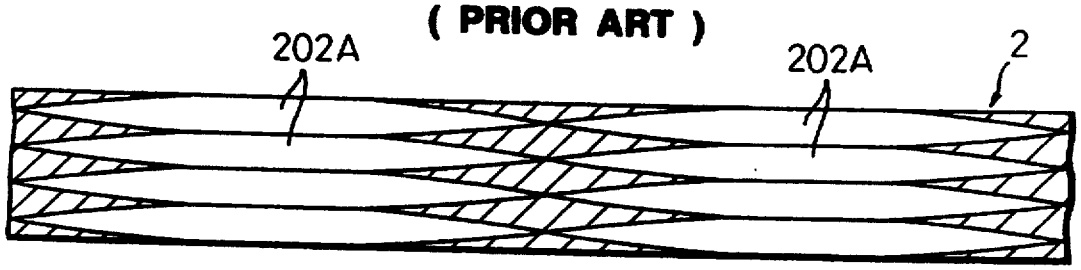
FIGS. 8A to 8C are views showing examples of the strip materials cut by the cutting apparatus the strip of the ribbon core using the slitter edge shown in FIGS. 7A and 7B.
Figure 8B:
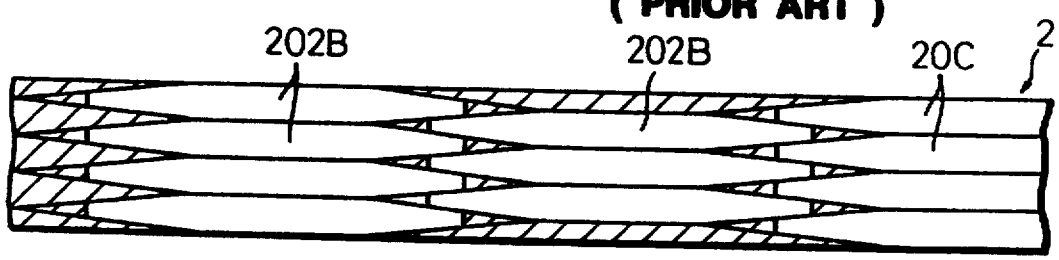
Figure 8C:
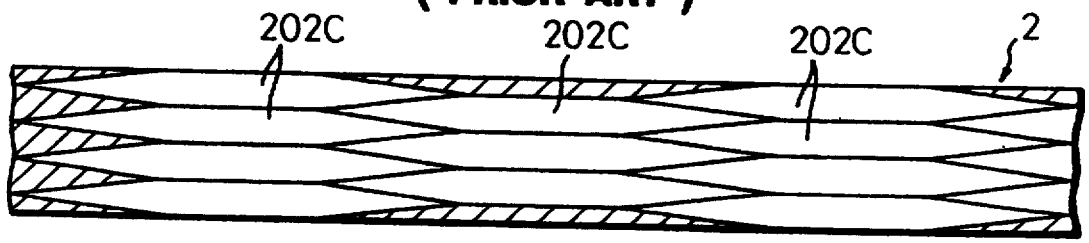

FIG. 6 shows an example of the slitter edge provided for the cutting apparatus for the strip of the ribbon core according to the prior art, FIGS. 7A and 7B show another example of the slitter edge provided for the cutting apparatus for the strip of the ribbon core according to the prior art, and FIGS. 8A to 8C show examples of the strip materials cut by the cutting apparatus for the strip of the ribbon core using the slitter edge shown in FIG. 7A and 7B.

The cutting apparatus shown in FIG. 6 is constructed to have four round teeth 8, 9 (81, 82, 83, 84; 91, 92, 93, 94) for cutting material 2 which are provided for respective shafts, for the apparatus shown in FIGS. 1 to 5B. Also, the cutting apparatus shown in FIGS. 7A and 7B is constructed to have respective three round teeth 8, 9 (81a, 82a, 83a; 91a, 92a, 93a: 81b, 82b, 83b; 91b, 92b, 93b) for cutting the material which are provided in two sets off-setting in the traveling direction of the material. Consequently, as shown in FIGS. 8A to 8C, a plurality of strips 202A, 202B, 202C can be cut in one time. It should be noted that, in FIGS. 8A to 8C, the hatched portions represents unnecessary material left after cutting the strips 202A, 202B and 202C.

FIG. 9 shows another example of a cutting apparatus for a strip of a ribbon core according to the prior art, and is designed to certainly obtain the predetermined cross-sectional configuration when the strip is wound on the winding jig.

As shown in FIG. 9, the strip material 2 wound in the coil form is cut by a pair of slitter round teeth 8, 9 into the strip 2B and the unnecessary material 2A, for example, via a tension adjusting mechanism. The strip 2B is temporarily wound on a temporary winding reef 55. Note, the reference numeral 52 denotes a thickness detector for detecting thickness of the material 2, 53 denotes a motor for adjusting cutting width for cutting the strip 2B by controlling the movable base (not shown), on which the slitter round teeth 8, 9 and so forth are provided, 54 denotes a motor for driving the temporary winding reef 55. Also, the reference numeral 56 denotes a start switch for the driving motor, 57 denotes a length measuring device for generating pulse signal corresponding to rotation of the slitter round teeth 8, and 60 denotes a numerical control unit.

The numerical control device 60 comprises an A/D converter 61 for A/D converting the output signal of the thickness detector 52, CPU 62, ROM 63, RAM 64, I/O 65 and so forth. The motor 53 is controlled on the basis of output of the thickness detector 52 and the output of the length measuring device 57, for adjusting the cutting width of the strip 2B. Therefore, the cutting apparatus for the ribbon core strip, shown in FIG. 9, is adapted to accurately obtain the predetermined cross-sectional configuration when the strip is wound on the winding jig, by effecting adjustment of the cutting width of the strip 2B corresponding to the length and thickness of the strip 2b.

As described above, there are various proposals for the cutting apparatus for the ribbon core strip (cutting apparatus for the strip of the ribbon core).

However, in the practical operation of cutting of the ribbon core strip, the prior art encounters the following problems to be solved.

At first, in view of the operation efficiency and material yield, it is required to cut two or more strips (formed strip material) from one strip material. Namely, the apparatus discussed with reference to FIGS. 1 to 5B is not satisfactory in this point.

Further, in order to accurately cut the strip with stabilizing of the strip in transverse direction, it is required to provide guide rollers immediately before and after (upstream and downstream) of the slitter edge (round teeth). However, it is difficult to arrange a plurality of such roller for a single plane on which a plurality of strips travel. Namely, the apparatus discussed with reference to FIGS. 6 to 8C is difficult to provide rollers immediately before and after the slitter edge.

Below, the preferred embodiments of a cutting apparatus for a strip of a ribbon core according to the present invention will be explained, with reference to the accompanying drawings.

FIGS. 10A and 10B fragmentally show an embodiment of a cutting apparatus for a ribbon core strip according to the present invention. Note, FIG. 10A is a plan view of the cutting apparatus, and FIG. 10B is a side elevation thereof. In FIGS. 10A and 10B, the reference numeral 102 denotes a strip material formed of a flat rolled magnetic steel strip or so forth, 110 and 120 denote slitter units, and 140 denotes an unnecessary material processing apparatus.

FIGS. 11A and 11b are views for explaining the operation of the slitter edge in the cutting apparatus for the strip of the ribbon core shown in FIGS. 10A and 10B. Note, FIG. 11A shows the operation of the slitter edge in the cutting apparatus of the ribbon core strip (cutting apparatus for the strip of the ribbon core) in FIGS. 10A and 10B, and FIG. 11B shows operation on the slitter edge in the cutting apparatus employing three slitter units. Namely, in the cutting apparatus for the ribbon core strip shown in FIG. 11B, 3 slitter units are arranged offsetting in the traveling direction of the material 102 and are designed to be independently controlled the angle of cutting the material 102. Note, in FIGS. 11A and 11B, the broken line represents a line potentially cut by the slitter round teeth in the material 102. In FIGS. 10A and 10B, the guide rollers 154a and 154b provided downstream of the slitter unit 110 can be neglected. Namely, since the material cut by the slitter unit 110 and directed to the slitter unit 120 becomes strip 102B after cutting of the slitter unit 120, the material 102 directed to the slitter unit 120 is not required substantial accuracy. Therefore, the guide rollers 154a and 154b provided downstream of the slitter unit 110 can be neglected.

FIGS. 12A and 12B show examples of strip materials to be cut by the cutting apparatus for the strip of the ribbon core according to the present invention. Note, FIG. 12A shows the configuration of the strip cut in the manner illustrated in FIG. 11A, and FIG. 12B shows the configuration of the strip cut in the manner illustrated in FIG. 11B. Note, FIGS. 12A and 12B are illustrated in the compressed scale in the longitudinal direction.

As shown in FIGS. 10A, 10B and 11A, the traveling strip material (material) 102 is cut into predetermined configurations of ribbon core strips 102A and 102B by means of a plurality of the slitter units 110 and 120. A plurality of slitter units 110 and 120 for cutting the material 102 are arranged mutually off-setting in the traveling direction of the material 102. Each slitter unit 110 and 120 are designed to be independently controlled the angle of cutting of the material 102. Furthermore, as can be clear from FIG. 10B, by means of the roller 155 provided above the traveling line of the material, one of the material 102B cut by the slitter unit 110 and 120 is fed in a manner upwardly rounding about the traveling line of the material through which the other cut material 102A travels. Note, as shown in FIG. 11B, in the cutting apparatus having 3 slitter units, for example, the one of the cut material (102A') cut by the slitter unit 120' is fed in the manner upwardly rounding about the traveling line of the other cut material (102B').

In FIGS. 10A and 10B, the reference numerals 161, 162 denotes width detectors comprising a light source and a photo detector, and in practice, the width detector 161 detecting the width of the traveling ribbon core strip 102A and the width detector 162 detecting the width of the traveling ribbon core strip 102B. Namely, the light from the light source provided below the strip is picked up by means of a camera with an image sensor and a dimension data of the shadow (dark portion) of the image corresponding to the strip width, is fed to a computer. In the computer, a difference of the predetermined width and the actual width for shifting the movable base driving motor (112, 122) over a magnitude necessary for correcting an error (it may be possible to add or subtract with respect to a position command. This correcting operation is required for every strips, continuously or, alternatively only at the position where the width of the strip becomes maximum. Thus, in the cutting apparatus for the ribbon core strip of the shown embodiment, since one of the material 102B cut by each of the slitter unit 110 and 120 is fed upwardly rounding about the traveling line of the other cut material 102A, a plurality of rollers and the width detectors can be provided for each of the strips 102A and 102B.

Furthermore, in the traveling direction of the strip material, respective guide rollers 152a, 152b, 153a, 153b, 154a, 154b; 156a, 156b, 157a, 1547b are provided upstream and downstream of each of the slitter unit 110 and 120 to enable precise cutting of the material 102. In practice, at the upstream of the slitter unit 110, guide rollers 152a and 152b are provided at both sides of the strip material 102 fed through the rollers 151a and 151b, and at the downstream of the slitter unit 110, the guide rollers 154a and 154b for holding both sides of one of the cut material 102 (strip 102B) cut by the slitter round teeth 118, 119 and guide rollers 153a and 153b are provided for holding both sides of the other material 102 ( strip 102A). On the other hand, at the upstream of the slitter unit 120, guide rollers 156a and 156b are provided, and at the downstream of the slitter unit 120, the guide rollers 157a and 157b are provided. Note, for part of the guide rollers 154a, 154b, 156a, 157v, springs are provided to enable to follow variation of the width of the material 102 (strip 102A, 102b).

Each slitter unit 110 (120) comprises a pair of slitter round teeth 118 and 119 (128, 129) for cutting the material 102, a movable base 111 (121) mounting a pair of slitter round teeth 118, 119 (128, 129), and cutting width controlling sections 112, 113, 114 (122, 123, 124). Namely, the cutting width controlling section comprises a drive motor 112 (122),a shaft 113 (123) and a feeding screw 114 (124). A pair of slitter round teeth 118, 119 (128, 129) provided in opposition across the material 102 are controlled in the width direction of the material 102 to cut the strips 102A and 102B into the predetermined configuration. Note, the reference numerals 102C denotes the unnecessary material left after cutting the predetermined configurations of the strips 102A and 102B from the material 102. This unnecessary material 102C is processed by the unnecessary material processing apparatus 140.

On the other hand, the strips 102A and 102B and so forth to be cut by means of the cutting apparatus for the ribbon core strip have a narrow width and are curved. Furthermore, since the slitter units 110, 120 and so forth are provided a swing mechanism and so forth for varying directions of the slitter round teeth 118, 119; 128, 129, errors inevitably occur with respect to the predetermined cutting width. Therefore, it is possible to automatically correct the width into a correct width by adding or subtracting for position command of the cutting width adjusting mechanism of the slitter unit when dimensional error is present relative to the predetermined width, by measurement of the width of the cut strips in order to correct an error in the strip. On the other hand, in the case that a plurality of strips are to be cut, a width dimension measurement of each strip is taken to independently effect the correcting operation for each of the slitter units.It should be appreciated, that the slitter units 110, 120 and so forth can be modified in various fashions. For example, though it is possible to employ the conventional slitter section as shown in FIGS. 1 and 2, it is also possible to provide a damper for the conventional slitter section.

On the other hand, as shown in FIGS. 10A, 10B and 11A, the strips 102A and 102B are differentiated with respect to the number of rollers to pass. Therefore, the resistance in traveling for respective strips is different. Practically speaking, the strip 102B passes through four more transverse guide rollers (156a, 156b, 157a, 157b) than the strip 102A. Therefore, the strip 102B exertes approximately three times greater contact resistance on the guide rollers, which are depressed to follow the variation of the width. Therefore, if a driving roller is common to the strips 102A and 102B, the magnitude of a slight slip upon driving becomes greater at the strip 102B thereby gradually releasing the strip 102B and concentrically causing tension on the strip 102A and possible shearing in the vicinity of the portion of the strip 102A having the minimum width. Also, accurate cutting of the strip 102B by the slitter unit 120 may not occur.

In order to avoid this, for example, the driving force of the strip 102B is directly acted thereon. On the other hand, the driving force of the strip 102A is transmitted through a friction material or so forth with separating from the driving roller so as to transmit the driving torque with an appropriate slip. By this, uniform tension can be provided for the strips 102A and 102B. Namely, in the cutting apparatus shown in FIGS. 10A and 10B, the strip 102A is driven by the driving rollers 158b and 158d, and the strip 102B is driven by the driving rollers 158a and 158c. Note, a friction member 159 is disposed between the driving rollers 158a and 158b.

In practice, as shown in FIGS. 10A and 10B, the driving rollers 158a and 158b are provided on the shaft 160a driven by the driving motor 160. The driving roller 158a for driving the strip 102B is fixed to the shaft 160a for directly transmitting the driving force of the driving motor 160 to the strip 102B. On the other hand, the driving roller 158b for driving the strip 102A is situated for free rotation relative to the shaft 160a. The driving force of the driving motor 160 is transmitted to the driving roller 158b is transmitted from the driving roller 158a via the friction member 159. Accordingly, for example, when concentric tension is applied to the strip 102A, by the slit between the driving roller 158a and the friction member 159 or slip between the friction member 159 and the driving roller 158b, the driving force on the driving roller 158b is lowered. As a result, uniform tension can be applied for the strips 102A and 102B.

However, in the case shown in FIGS. 10A, 10B and 11A, in practice, when the width of the strip 102A is minimum, the width of the strip 102B becomes approximately maximum, and conversely, when the width of the strip 102A is maximum, the width of the strip 102B becomes approximately minimum to alternate the slip magnitude to cause greater slip magnitude at greater tension; the tensions applied to the strips 102A and 102B are to be balanced. Accordingly, it is sufficient to slightly lower the driving force for the strip 102A without decreasing the accurate cutting of the strip 102B by the slitter unit 120. Note, if the strip 102A is driven independently with a constant torque, the balancing effect is lost and an excessive large tension is applied to the strip 102B, so that the strip 102B may be released. Furthermore, a fluctuation in the resistance is caused by the slitter round teeth. Therefore, driving the strips 102a and 102B at equal speed, and slightly lowering the driving force of the strip 102A, for example is desired even if there are three or more strips to be cut.

Figure 14:
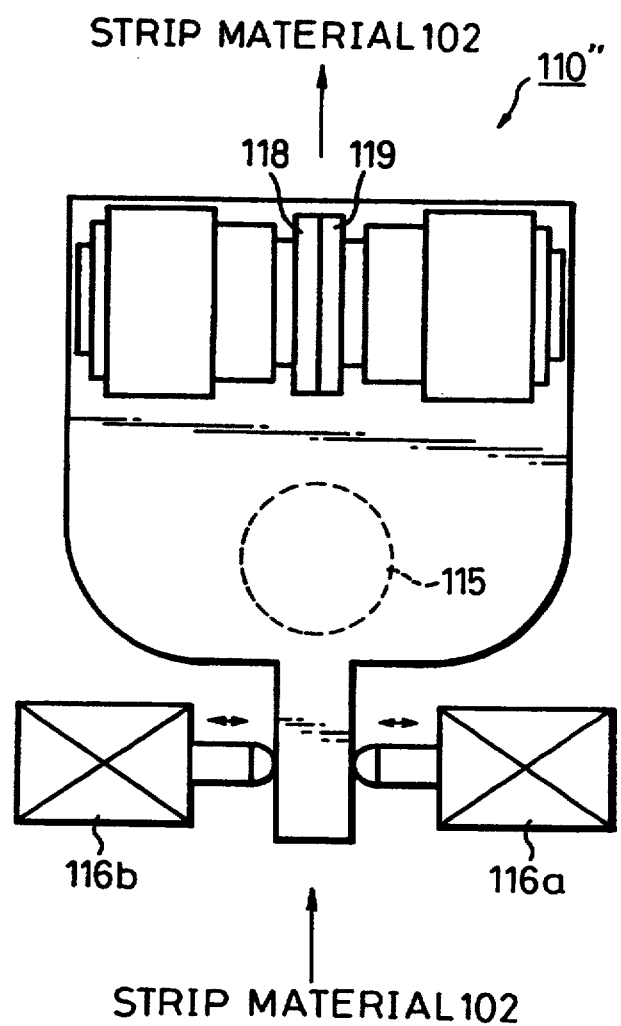
FIG. 14 is a view showing the modification of a slitter unit provided for the cutting apparatus for the strip of the ribbon core according to the present invention.

FIG. 14 shows a modification of a slitter unit provided for the cutting apparatus for the strip of the ribbon core according to the present invention. As shown in FIG. 14, the slitter unit 110", which is provided with slitter round teeth 118 and 119 is controlled the directions of the slitter round teeth 118, 119 about a rocking shaft 115 for enabling to cut the predetermined curved configuration:

On the other hand, the mechanism to vary the direction of the slitter round teeth 118 and 119 has inherent tendency to cause vibratory rocking motion due to principal of rocking mechanism or slight play and so forth, in comparison with the general slitters. Therefore, in the slitter unit 110" shown in FIG. 14, dampers 116a and 116b are provided at opposite sides of the slitter round teeth 118, 119 with respect to the rocking shaft 115 to damp vibration. By this, it becomes possible to increase the feeding speed. Note, the damper 116a and 116b can comprise oil dampers, for example, and the dampers 116a and 116v are fixed to the movable base (111).

Figure 15A:
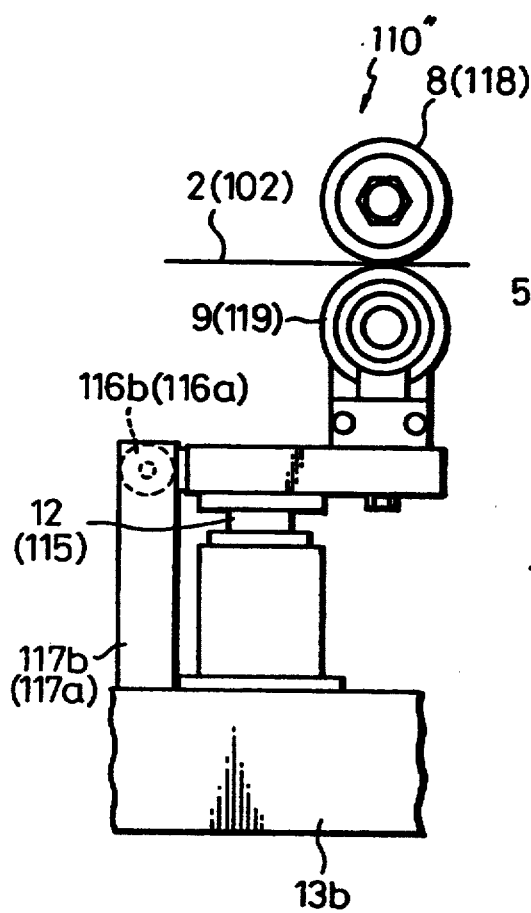
FIGS. 15A and 15B are views showing an example of practical construction of the slitter unit shown in FIG. 14.
Figure 15B:
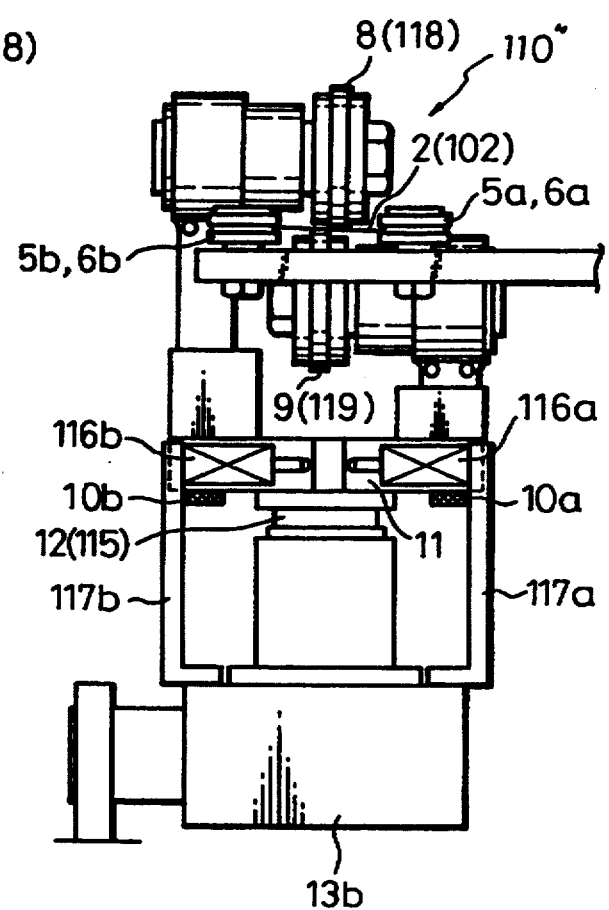

FIGS. 15A and 15B show an example of practical construction of the slitter unit shown in FIG. 14. As shown in FIG. 15A and 15B, the dampers 116a and 116b are provided for the slitter section in the conventional cutting apparatus for the ribbon core strip discussed with reference to FIGS. 1 and 2. Note, FIG. 15A is a front elevation, and FIG. 15B is a side elevation. It should be noted that the dampers 116a and 116v are fixed to the movable base 13b through stays 117, 117b.

As set forth above, the strips 102A, 102B, 102A', 102B' as shown in FIGS. 12A and 12B can be obtained. Note, as shown in FIG. 12B, only two strips 102A' and 102B' require three slitter units, and both sides of the material are not used. However, in general, the both side portions frequently have problems with regard to configuration and composition, and high quality can be maintained by avoiding such defective portions from the strip and disposing the same as the unnecessary materials 102C' and 102". Therefore, the strips 102A' and 102B' of FIG. 12B have high quality magnetic characteristics.

FIGS. 13A and 13B show the other examples of strip materials to be cut by the cutting apparatus for the strip of the ribbon core according to the present invention.

The strip 302A shown in FIG. 13A is cut by 2 slitter units, and the strip 302B shown in FIG. 13B is cut by 8 slitter units. Note, in case that the strip 302B shown in FIG. 13B is to be cut, it is possible to cut with 4 slitter units by providing 2 sets of slitter round teeth for each of the slitter units.

On the other hand, conventionally, the unnecessary material are wound, cut into small pieces or compressed. The amount of the unnecessary material is naturally preferred to as small as possible. For example, in case of the strip with thickness of 0.3 mm, cutting with minimum unnecessary material width of 0.3 mm is possible. If the unnecessary material is put in the disposing box or so forth without any process, the volume can become substantial. However, when the unnecessary material is wound, since the brittle high silicon steel of 0.3 mm width can be easily sheared to make it difficult to continuously wind. On the other hand, when the unnecessary material is cut into small pieces, it is possible to feed the brittle, thin and stiff due to presence of silicon or so forth, and curled strip to the chipping edge and stably chip at high speed. In addition, since the width of the strip can be fluctuate from 0.3 mm to several tens mm at the maximum, the cutting edge can be easily damaged.

Figure 16A:
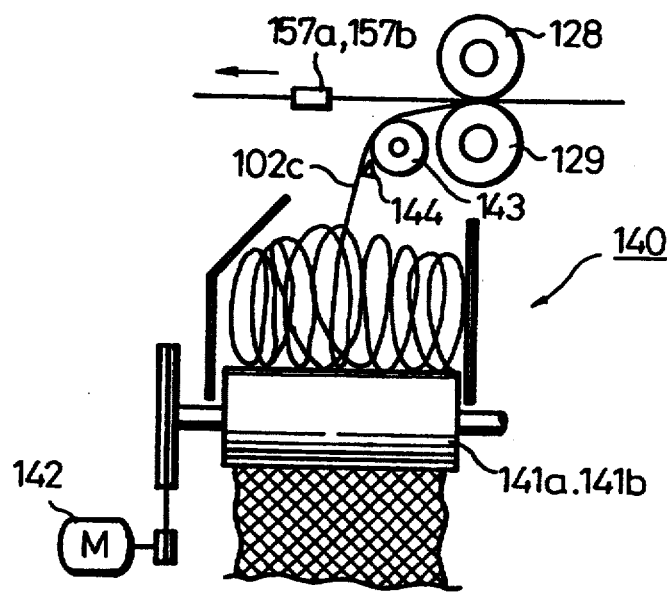
FIGS. 16A and 16B are views briefly showing an example of an unnecessary material processing apparatus provided for the cutting apparatus for the strip of the ribbon core shown in FIGS. 10A and 10B.
Figure 16B:
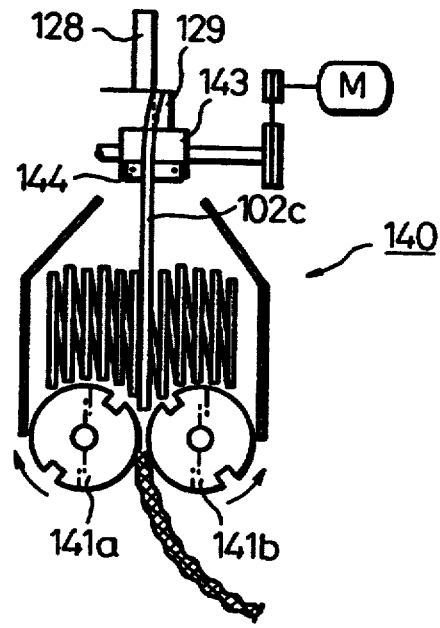

FIGS. 16A and 16B briefly show an example of an unnecessary material processing apparatus provided for the cutting apparatus for the strip of the ribbon core shown in FIGS. 10A and 10B. Note, FIG. 16A is a front elevation, and FIG. 16B is a side elevation.

In this embodiment, the unnecessary material is basically processed by compression. namely, the unnecessary material processing apparatus 140 in the shown embodiment, is provided below the traveling line of the material 102. The unnecessary material processing apparatus 140 is designed to crush the unnecessary material 102C with two rollers 141a and 141b with chamfering grooves.

As shown in FIGS. 16A and 16B, the unnecessary material processing apparatus 140 is designed to pass the mass form unnecessary material 102C between the rollers 141a and 141b which are driven at low speed, and thus compressed. In this case, the problem is how to establish the initial chamfering. It is required to set the distance between 2 rollers 141a and 141b to be less than or equal to 0.3 mm. In contrast, since the width of the unnecessary material fluctuates from 0.3 mm to several tens mm, for example, 2 chamfering grooves are provided for each rollers 141a and 141b in the shown embodiment of the unnecessary material processing apparatus. By these chamfering grooves, even when the width of the unnecessary material varies substantially, the unnecessary material can be certainly chamfered. Furthermore, the unnecessary material processing apparatus 140 comprises a magnet roller 143 for certainly guiding the unnecessary material, and an edge 144 for separating the drawn unnecessary material from the magnet roller 143. By the, the unnecessary material 102 even curling or broken can be certainly fed to the rollers 141a and 141b at the lower side. Needless to say, the chamfering grooves formed on the rollers 141a and 141b is not specified to 2.

The shown embodiment of the cutting apparatus for the ribbon core strip, as set forth above, is, of course. applicable for the cutting apparatus for the ribbon core strip illustrated in FIGS. 1 and 2 or for the cutting apparatus for the ribbon core strip in FIG. 9, and so forth.

As described above, in the cutting apparatus for the ribbon core strip according to the present invention, a plurality of slitter units are arranged with off-set in the traveling direction of the strip material, and the angle of cutting the strip of each of the slitter unit can be controlled independently. Furthermore, by upwardly or downwardly rounding above one of the cut strip relative to the traveling line of the other cut strip, it becomes possible to provide a plurality of rollers and the strip width detecting devices, and enables precisely cutting a plurality of strips in one time.

Many widely differing embodiments of the present invention may be constructed without departing from the spirit and scope of the present invention, and it should be understood that the present invention is not limited to the specific embodiments described in this specification, except as defined in the appended claims.

I claim:

1. A cutting apparatus for a strip of a ribbon core to which a cylindrical coil ribbon for winding is applied, for obtaining a predetermined configuration of ribbon core materials, comprising:
  a plurality of slitter units for cutting travelling strip material, wherein said slitter units are arranged in off-set positions in the traveling direction of said strip material, and means for directing one of the strip material cut by each of said slitter units to travel upwardly or downwardly at an angle to a traveling line through which the other of the cut strip material travels.

2. A cutting apparatus for a strip of a ribbon core as claimed in claim 1, wherein an angle for cutting said strip material of each of said slitter units is independently controlled.

3. A cutting apparatus for a strip of a ribbon core as claimed in claim 1, wherein guide rollers are provided upstream and downstream of each of said slitter units.

4. A cutting apparatus for a strip of a ribbon core as claimed in claim 3, wherein some of said guide rollers include width variation following means for following variation of the width of said strip materials.

5. A cutting apparatus for a strip of a ribbon core to which a cylindrical coil ribbon for winding is applied, for obtaining a predetermined configuration of ribbon core materials, comprising:

at least one slitter unit for cutting traveling strip material, wherein said slitter unit comprises a pair of slitter round teeth, a movable base mounting said pair of slitter round teeth, cutting width controlling means for controlling movement of said movable base in transverse direction of said strip material, and damping means for damping the vibration of said slitter round teeth.

6. A cutting apparatus as claimed in claim 5 comprising a plurality of slitter units.

7. A cutting apparatus for a strip of a ribbon core as claimed in claim 6, wherein said slitter units are arranged in off-set positions in the traveling direction of said strip material.

8. A cutting apparatus for a strip of a ribbon core as claimed in claim 7, wherein an angle for cutting said strip material of each of said slitter units is independently controlled.

9. A cutting apparatus as claimed in claim 6, wherein each of said slitter unit comprises a pair of slitter round teeth, a movable base mounting said pair of slitter round teeth, cutting width controlling means for controlling movement of said movable base in transverse direction of said strip material, and damping means for damping the vibration of said slitter round teeth.

10. A cutting apparatus for a strip of a ribbon core to which a cylindrical coil ribbon for winding is applied, for obtaining a predetermined configuration of ribbon core materials, comprising:

a plurality of slitter units for cutting traveling strip material and a drive means for driving a plurality of strip materials cut by said slitter units, wherein said slitter units are arranged in off-set positions in the traveling direction of said strip material and wherein said drive means comprises a first driving roller fixed on an axle rotatably driven by a driving motor, and a second driving roller rotatably mounted on said axle and rotatably driven by said first driving roller through a friction member;

said drive means maintaining a uniform tension of the cut strip materials.

11. A cutting apparatus for a strip of a ribbon core as claimed in claim 10, wherein an angle for cutting said strip material of each of said slitter units is independently controlled.

12. A cutting apparatus for a strip of a ribbon core for obtaining a predetermined configuration of ribbon core materials by cutting traveling strip material by means of a plurality of slitter units, wherein said cutting apparatus comprises a plurality of width detecting means for detecting a width of each of said ribbon core materials cut by said slitter units, and further wherein said slitter units are arranged in off-set positions in the traveling direction of said strip material.

13. A cutting apparatus for a strip of a ribbon core as claimed in claim 12, wherein an angle for cutting said strip material of each of said slitter units is independently controlled.

* * * * *